(12) United States Patent
Kim et al.

(10) Patent No.: US 12,336,379 B2
(45) Date of Patent: Jun. 17, 2025

(54) DISPLAY DEVICE WHICH IS CAPABLE OF DISPERSING STRESS APPLIED THERETO

(71) Applicant: Samsung Display Co., Ltd., Yongin-Si (KR)

(72) Inventors: Suk Kim, Hwaseong-si (KR); Hoon Gi Lee, Suwon-si (KR); Sang Hyun Choi, Seoul (KR); Chaun Gi Choi, Suwon-si (KR); Sang Hyun Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 708 days.

(21) Appl. No.: 17/672,003

(22) Filed: Feb. 15, 2022

(65) Prior Publication Data

US 2023/0041805 A1 Feb. 9, 2023

(30) Foreign Application Priority Data

Aug. 9, 2021 (KR) .................... 10-2021-0104337

(51) Int. Cl.
*H10K 50/844* (2023.01)
*G06F 3/044* (2006.01)
(Continued)

(52) U.S. Cl.
CPC .......... *H10K 50/844* (2023.02); *H10K 71/00* (2023.02); *G06F 3/044* (2013.01); *H10K 59/12* (2023.02);
(Continued)

(58) Field of Classification Search
CPC ...... H10K 50/844; H10K 71/00; H10K 59/12; H10K 59/40; H10K 77/111;
(Continued)

(56) References Cited

U.S. PATENT DOCUMENTS

| 5,246,732 A | 9/1993 | van der Putten |
| 6,528,417 B1 | 3/2003 | Wang et al. |
| (Continued) | | |

FOREIGN PATENT DOCUMENTS

| CN | 111524941 A | 8/2020 | |
| CN | 111754870 A | * 10/2020 | ............. G09F 9/301 |
| KR | 2020-0138544 A | 12/2020 | |

OTHER PUBLICATIONS

Machine Translation of CN-111754870 (Year: 2020).*
(Continued)

*Primary Examiner* — J. E. Schoenholtz
(74) *Attorney, Agent, or Firm* — Innovation Counsel LLP

(57) ABSTRACT

The present disclosure relates to a display device. According to an embodiment of the present disclosure, a display device includes a supporter including a plurality of segments disposed to be spaced apart from each other and defining a plurality of holes between the plurality of segments, and a display panel disposed on the supporter. The display panel includes: an active element layer including a light emitting element and a thin film transistor for driving the light emitting element, an encapsulation layer disposed on the active element layer, a plurality of stress dispersion pattern disposed on the encapsulation layer to overlap the plurality of holes in a thickness direction, and an insulating layer disposed on the plurality of stress dispersion pattern and filling a plurality of holes defined between the plurality of stress dispersion pattern.

17 Claims, 16 Drawing Sheets

(51) Int. Cl.
  *H10K 59/12*      (2023.01)
  *H10K 59/40*      (2023.01)
  *H10K 71/00*      (2023.01)
  *H10K 77/10*      (2023.01)
  *H10K 102/00*     (2023.01)

(52) U.S. Cl.
  CPC ............ *H10K 59/40* (2023.02); *H10K 77/111* (2023.02); *H10K 2102/311* (2023.02)

(58) Field of Classification Search
  CPC .. H10K 2102/311; H10K 50/84; G06F 3/044; G06F 1/1652; G06F 3/0412; G09F 9/301; H04M 1/0268
  See application file for complete search history.

(56) References Cited

U.S. PATENT DOCUMENTS

| | | | |
|---|---|---|---|
| 2018/0204895 A1 | 7/2018 | Lin et al. | |
| 2019/0371214 A1* | 12/2019 | Kim | H10K 50/84 |
| 2020/0166970 A1* | 5/2020 | Yeom | H04M 1/0268 |
| 2021/0020865 A1* | 1/2021 | Kim | H10K 59/8731 |
| 2021/0057679 A1 | 2/2021 | Xie et al. | |

OTHER PUBLICATIONS

Definition of 'hole' downloaded from URL<https://www.merriam-webster.com/dictionary/hole> on Nov. 14, 2024 (Year: 2024).*
Extended European Search Report corresponding to Application No. 22186380.6 dated Jan. 5, 2023, 12 pages.

* cited by examiner

DP: MR, BR1, BR2, ER1, ER2

DISPLAY DEVICE WHICH IS CAPABLE OF DISPERSING STRESS APPLIED THERETO

CROSS-REFERENCE TO RELATED APPLICATION

This application claims priority to Korean Patent Application No. 10-2021-0104337 filed on Aug. 9, 2021, and all the benefits accruing therefrom under 35 U.S.C. § 119, the content of which in its entirety is herein incorporated by reference.

BACKGROUND

1. Field of the Disclosure

The present disclosure relates to a display device.

2. Description of the Related Art

With the advancement of multimedia, importance of a display device has been enhanced. Accordingly, various types of display devices such as a liquid crystal display (LCD) device and an organic light emitting display (OLED) device have been used.

Meanwhile, a mobile electronic device includes a display device for providing an image to a user. Recently, a bendable display device, a foldable display device, a rollable display device, a slidable display device and a stretchable display device have been developed using a flexible display panel that may be bent, folded or rolled. It is important to relieve stress applied to the flexible display panel in the design of such a display device.

SUMMARY

Embodiments of the current disclosure to provide a display device that may disperse stress applied to a display panel.

According to an embodiment of the present disclosure, a display device includes a supporter including a plurality of segments disposed to be spaced apart from each other and including a plurality of opening disposed between the plurality of segments, and a display panel disposed on the supporter. The display panel includes: an active element layer including a light emitting element and a thin film transistor for driving the light emitting element, an encapsulation layer disposed on the active element layer, a plurality of stress dispersion patterns disposed on the encapsulation layer to overlap the plurality of openings in a thickness direction, and an insulating layer disposed on the plurality of stress dispersion patterns and filling a plurality of holes disposed between the plurality of stress dispersion patterns.

Each of the plurality of openings may overlap at least one of the holes in the thickness direction.

Each width of the plurality of holes in a cross-sectional view may be increased toward the encapsulation layer.

A width of the insulating layer filled in the plurality of holes in a cross-sectional view may be increased toward the encapsulation layer.

At least one surface of the plurality of stress dispersion patterns have an uneven shape in a cross-sectional view.

The plurality of stress dispersion patterns may include an organic insulating material.

The organic insulating material may include at least one of an acrylic resin, a methacrylate-based resin, polyisoprene, a vinyl-based resin, an epoxy-based resin, a urethane-based resin, a cellulose-based resin, a siloxane-based resin, a polyimide-based resin, a polyamide-based resin and a perylene-based resin.

The plurality of stress dispersion patterns may be extended in a direction parallel to a direction in which the plurality of openings extend in a plane view.

The plurality of stress dispersion patterns may extend in a direction crossing a direction in which the plurality of openings extend in a plan view.

The display panel may include a main area, an extension area overlapped with the main area in the thickness direction, and a bending area disposed between the main area the extension area, the display device further include a roller disposed adjacent the bending area, moving in a first direction and rotating in a first rotational direction or a second rotational direction.

When the roller moves toward one side of the first direction and rotates in the first rotational direction, the extension area rimy move toward one side of the first direction. When the roller moves toward the other side of the first direction and rotates in the second rotation direction, the extension area may move toward the other side of the first direction.

A thickness of the supporter in the main area may be thinner than a thickness of each of the plurality segments.

According to art embodiment of the present disclosure, a display device includes a supporter including a plurality of openings, an encapsulation layer disposed on the supporter, a plurality of stress dispersion patterns disposed on the encapsulation layer and spaced apart from each other to define a plurality of openings disposed between the plurality of stress dispersion patterns, an insulating layer disposed on the plurality of stress dispersion patterns to fill the plurality of openings. The plurality of stress dispersion patterns may be disposed to overlap the openings of the supporter in a thickness direction.

The plurality of stress dispersion patterns may include an organic insulating material, and each width of the plurality of openings may be increased toward the encapsulation layer in a cross-sectional view.

The display device may further include a display panel including the encapsulation layer, the plurality of stress dispersion patterns and the insulating layer. A roller may be disposed adjacent to a bending area, moving in a first direction, and rotating in a first rotational direction or a second rotational direction. The display panel may include a main area, an extension area overlapped with the main area in the thickness direction and a bending area disposed between the main area and the extension area.

When the roller moves toward one side of the first direction and rotates in the first rotational direction, the extension area may move toward one side of the first direction. When the roller moves toward the other side of the first direction and rotates in the second rotational direction, the extension area may move toward the other side of the first direction.

The supporter may include a plurality of segments disposed to be spaced apart from each other. A thickness of the supporter in the main area may be thinner than a thickness of the segment.

According to art embodiment of the present disclosure, a method of fabricating a display device, the method includes forming an organic layer on an encapsulation layer overlapped with a plurality of segments disposed in a supporter, forming a plurality of stress dispersion patterns by patterning the organic layer, and forming an insulating layer on the plurality of stress dispersion patterns to fill holes disposed between the plurality of stress dispersion patterns.

The forming a plurality of stress dispersion patterns by patterning the organic layer may include patterning the organic layer such that the plurality of stress dispersion patterns overlap an opening disposed between the plurality of segments.

The forming a plurality of stress dispersion patterns by patterning the organic layer may include etching the organic layer so that each width of the plurality of openings disposed between the plurality of stress dispersion patterns is increased toward the encapsulation layer in a cross-sectional view.

BRIEF DESCRIPTION OF THE DRAWINGS

The above and other features of the inventive concept will become more apparent by describing in detail embodiments thereof with reference to the accompanying drawings, in which.

DETAILED DESCRIPTION OF THE EMBODIMENTS

Figure 1:
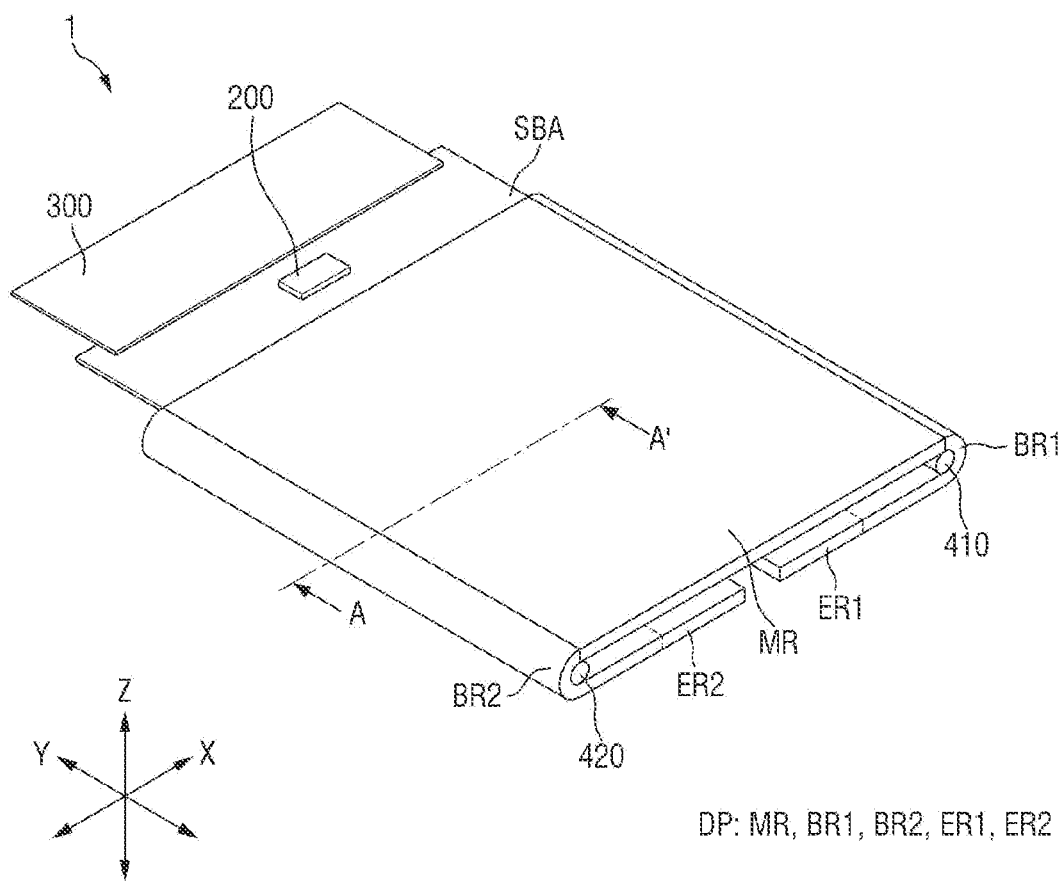
FIG. 1 is a perspective view illustrating a display device according to one embodiment of the present disclosure.

The inventive concept now will be described more fully hereinafter with reference to the accompanying drawings, in which various embodiments are shown. This inventive concept may, however, be embodied in many different forms and should not be construed as limited to the embodiments set forth herein. Rather, these embodiments are provided so that this disclosure will be thorough and complete and will fully convey the scope of the inventive concept to those skilled in the art. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include: deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the inventive concept present disclosure will be described in detail with reference to the accompanying drawings.

Figure 2:
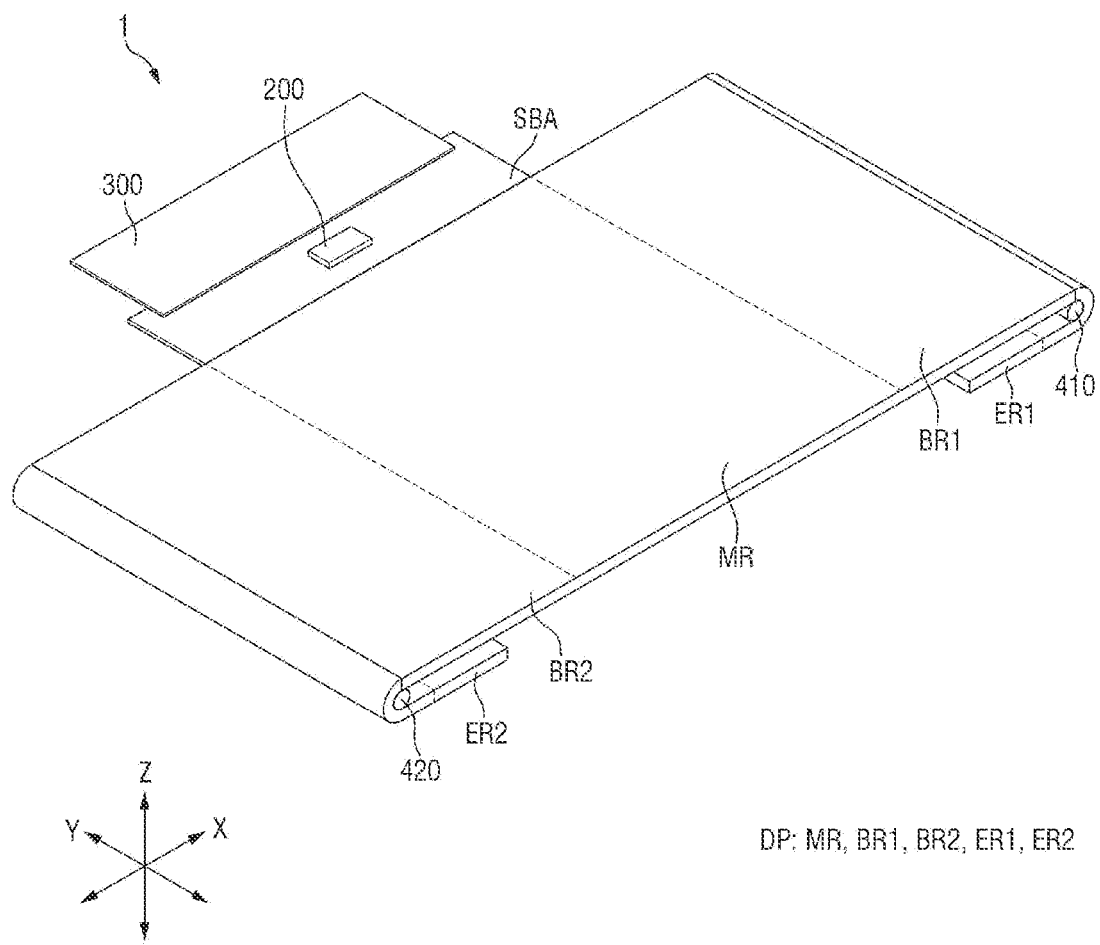
FIG. 2 is a perspective view illustrating a display device according to one embodiment of the present disclosure, which is in a sliding state.

FIG. 1 is a perspective view illustrating a display device according to one embodiment of the present disclosure. FIG. 2 is a perspective view illustrating a display device according to one embodiment of the present disclosure, which is in a sliding state.

Hereinafter, a first direction X, a second direction Y and a third direction Z cross one another in different directions. For example, the first direction X may be a length direction, the second direction Y may be a width direction, and the third direction Z may be a thickness direction or a height direction. The first direction X, the second direction Y and the third direction Z may include two or more directions. For example, the third direction Z may include art upper direction oriented toward an upper side on a drawing and a lower direction oriented toward a lower side of the drawing. In this case, one surface of a member disposed to face the upper direction may be referred to as an upper surface, and the other surface of a member disposed to face the lower direction may be referred to as a lower surface. The upper direction and the lower direction may be referred to as a front direction and a rear direction, respectively. However, it should be understood that the directions refer to relative directions and are trot limited to the above example.

A display device 1 according to one embodiment of the present disclosure may include various devices for displaying a screen or an image. For example, the display device 1 may include, but is not limited to, a smart phone, a cellular phone, a tablet PC, a personal digital assistant (PDA), a portable multimedia player (PMP), a television, a game machine, a wrist watch type electronic device, a head mounted display, a monitor of a personal computer, a notebook computer, a vehicle navigator, a vehicle dashboard, a digital camera, a camcorder, an external advertisement board, an electronic display board, various medical devices, various inspection devices, various home appliances including a display unit such as a refrigerator and a washing machine, a device for Internet of Things (IoT), etc.

Referring to FIG. 1, the display device 1 may include a display panel DP, a display driver 200, a circuit, board 300, a first roller 410, and a second roller 420.

The display panel DP may be a light emitting display panel DP that includes a light emitting element. For example, the display panel DP may be an organic light emitting display panel using an organic light emitting diode including an organic light emitting layer, a micro light emitting diode (LED) display panel using a micro LED, a quantum dot light emitting display panel using a quantum dot light emitting diode including a quantum dot light emitting layer, or an inorganic light emitting display panel using an inorganic light emitting diode including an inorganic semiconductor. Hereinafter, the description will be based on that the display panel DP is an organic light emitting display panel.

The display panel DP may be a flexible display panel that is curved, twisted or bent by the first roller 410 and the second roller 420. The display panel DP may include a main area MR, a sub-area SBA, a first bending area BR1, a second bending area BR2, a first extension area ER1 and a second extension area ER2.

The main area MR may be an area disposed on a front surface of the display device 1 and mainly viewed by a user. The main area MR may be an area exposed in the upper direction before the display panel DP is unrolled or unfolded The main area MR may display an image in the third direction Z, for example, the upper direction (front direction) of FIG. 1.

The sub-area SBA may be an area that is curved, twisted or bent. When the sub-area. SBA is curved, the sub-area SBA may overlap the main area MR in the third direction (Z-axis direction). The sub-area SBA may have a rectangular plane shape, but the shape of the sub-area SBA is not limited thereto.

A length of the sub-area SBA in the first direction (X-axis direction) may substantially be the same as a length of the main area MR in the first direction (X-axis direction). Alternatively, the length of the sub-area SBA in the first direction (X-axis direction) may be smaller than the length of the main area MR in the first direction (X-axis direction). A length of the sub-area SBA in the second direction (Y-axis direction) may be shorter than the length of the main area MR in the second direction (Y-axis direction).

The sub-area SBA may include a pad area (not shown) connected to the circuit board 300 and overlapping the circuit board 300. Alternatively, the sub-area SBA may be omitted, and in this case, the pad area PDA may be disposed in the main area MR.

The first bending area BR1 may connect the main area MR with the first extension area ER1. One side of the first bending area BR1 may be connected to the main area MR and the other side of the first bending area BR1 may be connected to the first extension area ER1.

The second bending area BR2 may connect the main area MR with the second extension area ER2, One side of the second bending area BR2 may be connected to the main area MR and the other side of the second bending area BR2 may be connected to the second extension area ER2.

The first bending area BR1 and the second bending area BR2 may be areas that are curved, twisted or bent. The first bending area BR1 may be curved, twisted or bent along the first roller 410. The second bending area BR2 may be curved, twisted or bent along the second roller 420.

Each of a length of the first bending area BR1 in the first direction (X-axis direction) and a length of the second bending area BR2 in the first direction (X-axis direction) may be smaller than the length of the main area MR in the first direction (X-axis direction). Each of a length of the first bending area BR1 in the second direction (Y-axis direction) and a length of the second bending area BR2 in the second direction (Y-axis direction) may substantially be the same as the length of the main area MR in the second direction (Y-axis direction).

As shown in FIGS. 1 and 2, a portion of the first bending area BR1, which is bent, may display an image in a right direction on the drawing. Another portion of the first bending area BR1, which excludes the portion of the first bending area BR1, may display an image in the upper direction or the lower direction. A portion of the second bending area BR2, which is bent, may display an image in a left direction on the drawing. Another portion of the second bending area BR2, which excludes the portion of the second bending area BR2, may display an image in the upper direction or the lower direction.

The first extension area ER1 may be connected to the first bending area BR1. The first extension area ER1 may be disposed to be parallel with the main area MR with the first roller 410 or the first bending area BR1 interposed therebetween. The first extension area ER1 may display an image in a direction opposite to a direction in which the main area MR displays an image, for example, in the lower direction of FIG. 1.

The second extension area ER2 may be connected to the second bending area BR2. The second extension area ER2 may be disposed to be parallel with the main area MR with the second roller 420 or the second bending area BR2 interposed therebetween. The second extension area ER2 may display an image in a direction opposite to the direction in which the main area MR displays an image, for example, in the lower direction of FIG. 1.

As described below, the first extension area ER1 and the second extension area ER2 is movable with respect to the main area MR as positions of the bent portion in the first bending area BR1 and the second bending area BR2 is varied. In other words, the display device 1 may be configured such that the first expansion area ER1 and the second extension area ER2 may be slid with respect to the main area MR.

The display driver 200 may output signals and voltages for driving the display panel DP. For example, the display driver 200 may output data voltages to data lines of the display panel DP and may output a power voltage to a power line of the display panel DP.

The display driver 200 may be formed of an integrated circuit (IC), and may be attached onto the sub-area SBA of the display panel DP in a chip on glass (COG) method, a chip on plastic (COP) method or an ultrasonic method. Alternatively, the display driver 200 may be attached onto the circuit board 300.

The circuit board 300 may be attached onto the pad area of the display DP by using an anisotropic conductive film (ACF). The circuit board 300 may electrically be connected to the pad area of the display panel DP. The circuit board 300 may be a flexible printed circuit board, a printed circuit board, or a flexible film such as a chip on film.

The first roller 410 may be disposed below the first bending area BR1 and the second roller 420 may be disposed below the second bending area BR2. Each of the first roller 410 and the second roller 420 may extends in the second direction (Y-axis direction). Also, each of the first roller 410 and the second roller 420 may move along the first direction (X-axis direction). Also, each of the first roller 410 and the second roller 420 may rotate in a first rotational direction or a second rotational direction. The first rotational direction may be a clockwise direction and the second rotational direction may be a counterclockwise direction. That is, each of the first roller 410 and the second roller 420 gray move in the first direction (X-axis direction) and may rotate in the first rotational direction or the second rotational direction.

When the first roller 410 moves to a right side and rotates in the second rotational direction, the first bending area BR1 viewed from the front surface of the display device 10 is widened, and the first extension area ER1 may move to the right side. When the second roller 420 moves to a left side and rotates in the first rotational direction, the second bending area BR2 viewed from the front surface of the display device 10 is widened, and the second extension area ER2 may move to the left side. That is, when the first roller 410 moves to the right side and rotates in the second rotational direction, and the second roller 420 moves to the left side and rotates in the first rotational direction, the display device 10 may be switched from a first state which is rolled or folded to a second state which is unrolled or unfolded.

In contrast, when the first roller 410 moves to the left side and rotates in the first rotational direction, the first bending area BR1 viewed from the front surface of the display device 10 is narrowed, and the first extension area ER1 may move to the left side. When the second roller 420 moves to the right side and rotates in the second rotational direction, the second bending area BR2 viewed from the front surface of the display device 10 is narrowed, and the second extension area ER2 may move to the right side. That is, when the first roller 410 moves to the left side and rotates in the first rotational direction, and the second roller 420 moves to the right side and rotates in the second rotational direction, the display device 10 may be switched from the second state to the first state.

Most of the first bending area BR1 and the second bending area BR2 in the second state of the display device 10 may be viewed from the front surface of the display device 10. In the first state of the display device 10, the first bending area BR1 and the second bending area BR2 may be hardly viewed from the front surface of the display device 10. For example, in the second state of the display device 10, the first bending area BR1 and the second bending area BR2 may be viewed from right and left edges of the display device 10.

A length of the display panel DP in the first direction (X-axis direction) in the second state of the display device 10 may be longer than that of the display panel DP in the first direction (X-axis direction) in the first state of the display device 10. Further, in the second state of the display device 10, a size of the first bending area BR1 overlapped with the main area MR in the third direction (Z-axis direction) may be smaller than that of the first bending area BR1 that is not overlapped with the main area MR in the third direction (Z-axis direction). In contrast, the size of the first bending area BR1 overlapped with the main area MR in the third direction (Z-axis direction) in the first state of the display device 10 may be greater than that of the first bending area BR1 that is not overlapped with the main area MR in the third direction (Z-axis direction). Also, a size of the second bending area BR2 overlapped with the main area MR in the third direction (Z-axis direction) in the second state of the display device 10 may be smaller than that of the second bending area BR2 that is not overlapped with the main area MR in the third direction (Z-axis direction). In contrast, the size of the second bending area BR2 overlapped with the main area MR in the third direction (Z-axis direction) in the first state of the display device 10 may be greater than that of the second bending area BR2 that is not overlapped with the main area MR in the third direction (Z-axis direction).

Since the first bending area BR1 is curved, twisted or bent along the rotation of the first roller 410, a radius of curvature of the first oiler 410 and a radius of curvature of the first bending area BR1 may substantially be the same as each other. Since the second bending area BR2 is curved, twisted or bent along the rotation of the second roller 420, a radius of curvature of the second roller 420 and a radius of curvature of the second bending area BR2 may substantially be the same as each other. In addition, since the radius of curvature of the first roller 410 and the radius of curvature of the second roller 420 may substantially be the same as each other, the radius of curvature of the first bending area BR1 and the radius of curvature of the second bending area BR2 may substantially be the same as each other. Moreover, when the sub-area SBA is curved, in order to prevent the sub-area SBA from interfering with the first bending area BR1 and the second bending area BR2, the radius of curvature of the sub-area SBA may be different from the radius of curvature of the first bending area BR1 or the radius of curvature of the second bending area BR2. For example, the radius of curvature of the sub-area SBA may be smaller than the radius of curvature of the first bending area BR1 and the curvature of the second bending area BR2.

As shown in FIG. 1 and FIG. 2, by moving the first roller 410 and/or the second roller 420 along the X-axis direction, a size of the display panel DP viewed from the front surface of the display device 10, that is, a size of a display area on which an image is displayed, may be adjusted. Therefore, a user may select the size of the display panel DP by adjusting the display device 10 to the first state or the second state in accordance with a purpose of use of the display device 10.

Figure 3A:
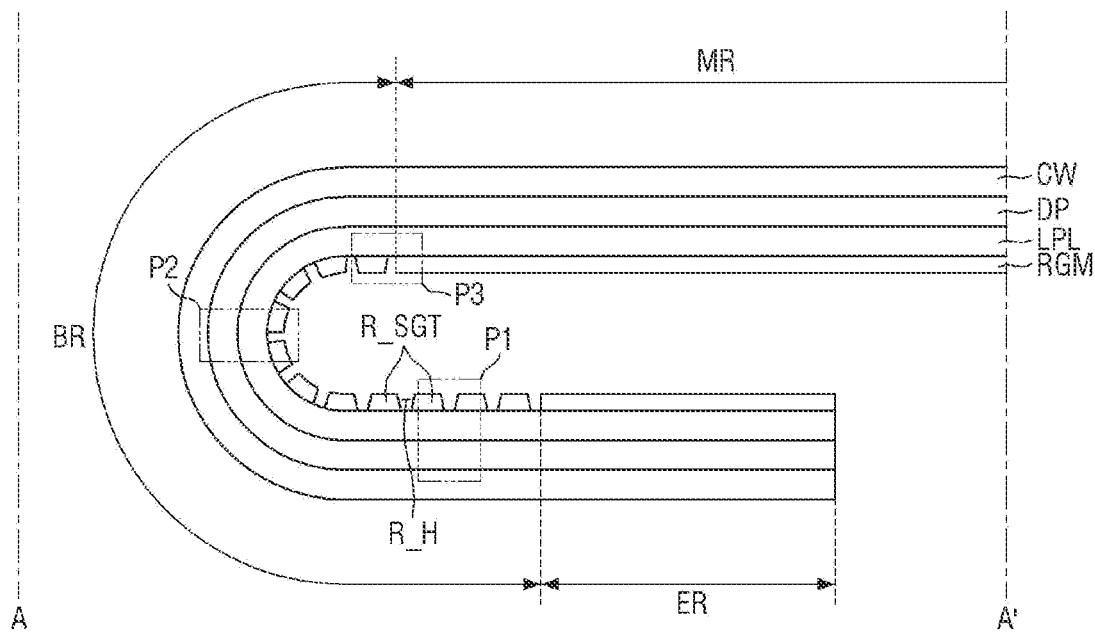
FIG. 3A is a cross-sectional view taken along line A-A' of FIG. 1.
Figure 4:
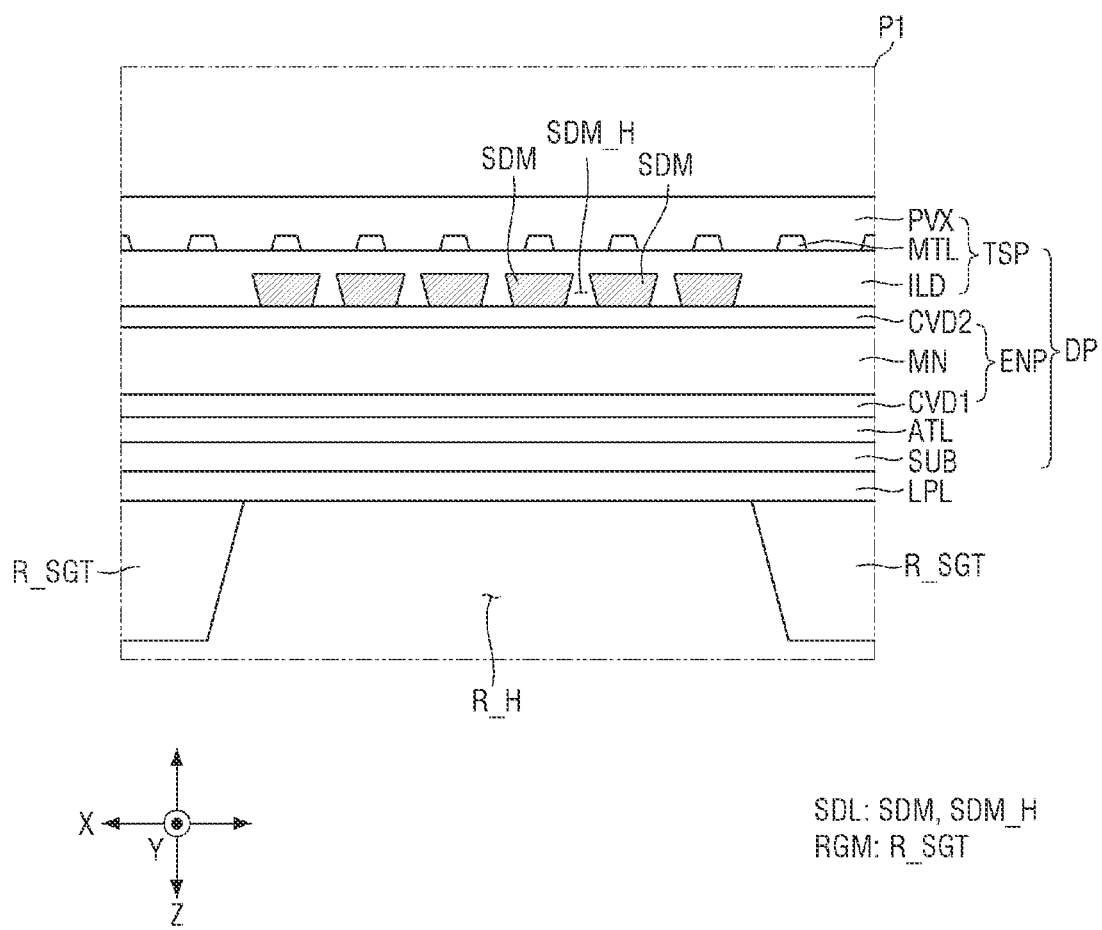
FIG. 4 is an enlarged cross-sectional view illustrating a portion 'P1' of FIG. 3A.
Figure 5:
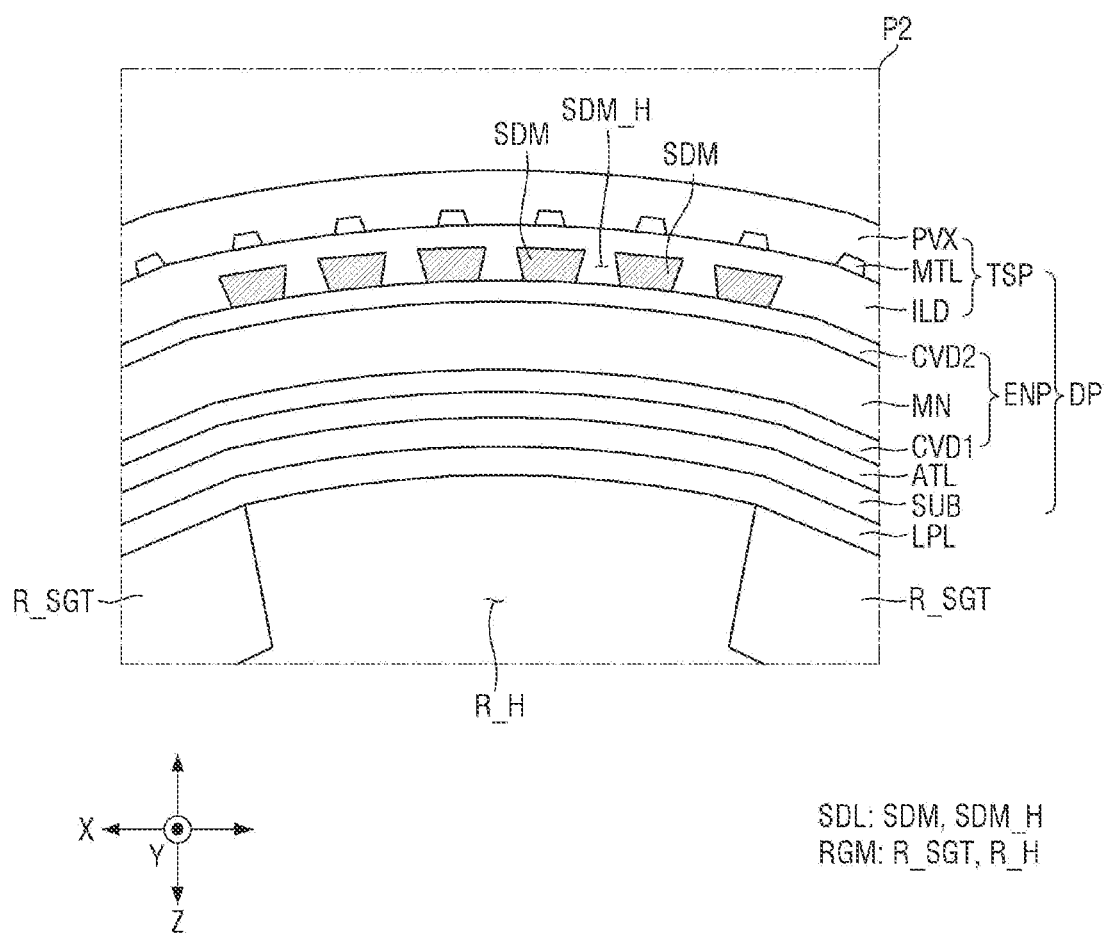
FIG. 5 is an enlarged cross-sectional view illustrating a portion 'P2' of FIG. 3A.
Figure 6:
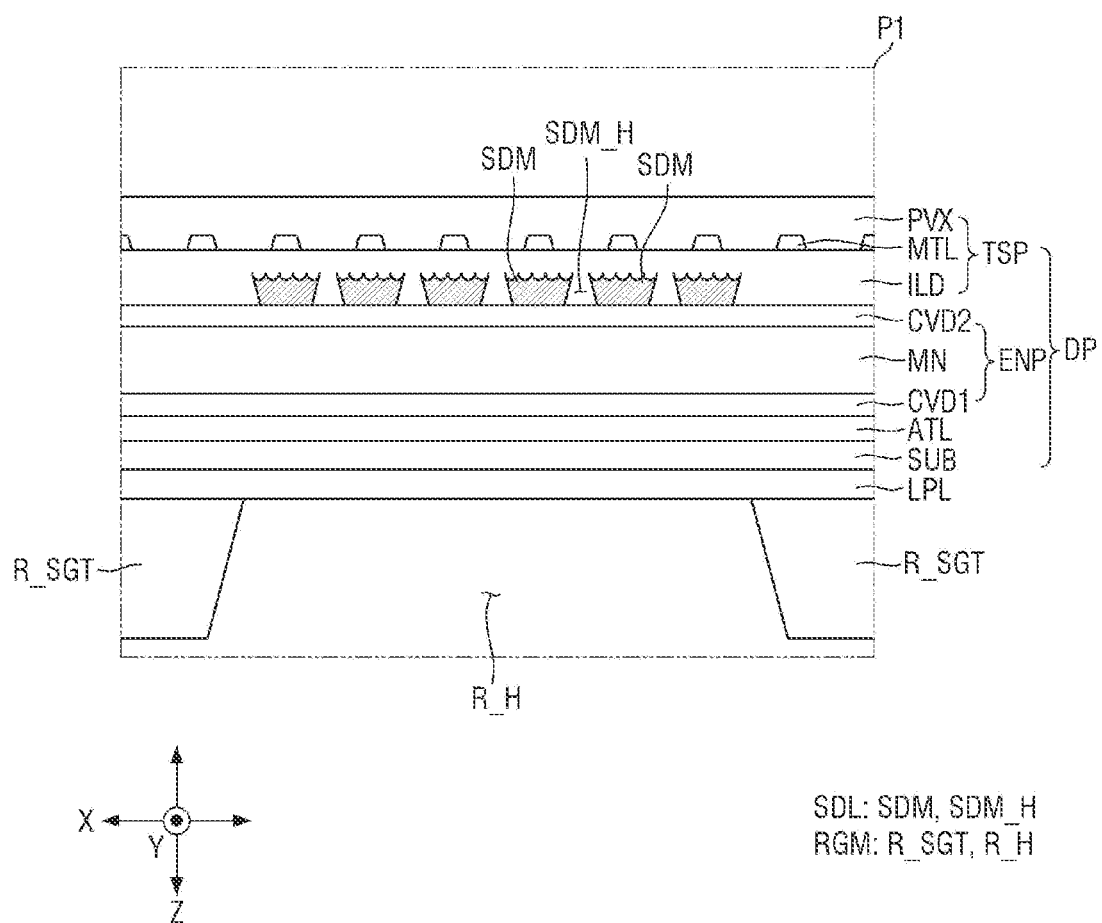
FIG. 6 is a plan view illustrating a plurality of stress dispersion patterns according to one embodiment of the present disclosure.

FIG. 3A is a cross-sectional view taken along line A-A' of FIG. 1. FIG. 4 is an enlarged cross-sectional view of a portion 'P1' of FIG. 3A. FIG. 5 is an enlarged cross-sectional view of a portion 'P2' of FIG. 3A. FIG. 6 is a plan view illustrating a plurality of stress dispersion patterns SDM according to one embodiment of the present disclosure.

Referring to FIGS. 1 to 3A, the display device 1 may further include a cover window CW, a lower panel layer LPL and a supporter RGM.

The cover window CW, the lower panel layer LPL and the supporter RGM may be disposed to overlap the main area MR, the bending area BR and the extension area ER.

The cover window CW may be disposed on one surface of the display panel DP. As described above, one surface of the display panel DP may be a surface for displaying an image, and the other surface of the display panel DP may be an opposite surface of the one surface.

The cover window CW may serve to protect the display panel DP. The cover window CW may be made of a transparent material. The cover window CW may include, for example, glass or plastic. The cover window CW may have flexibility, and thus may be curved. In some embodiments, an anti-reflective layer or polarizing layer for attenuating external light reflection may further be disposed between the cover window CW and the display panel DP.

The lower panel layer LPL may be disposed on the other surface of the display panel DR. In FIG. 3A, the lower panel layer LPL is shown as a single layer, but a number of the lower panel layer LPL is not limited thereto. The lower panel layer LPL may be comprised of a plurality of layers.

The lower panel layer LPL may include at least one functional layer. For example, the functional layer may include at least one of a protective film layer, a digitizer, an electromagnetic wave shielding layer, an impact absorbing layer or a heat dissipation layer, but the functional layer is not limited thereto.

The supporter RGM may be disposed on the lower panel layer LPL. In detail, the lower panel layer LPL may include one surface facing the display panel DP and the other surface opposite to the one surface, and the supporter RGM may be disposed on the other surface of the lower panel layer LPL.

The supporter RGM may perform a function of supporting structures deposited on the supporter RGM. The supporter RGM may further perform a heat dissipation function. The supporter RGM may have rigidity greater than that of the display panel DP, the lower panel layer LPL or the cover window CW.

The supporter RGM may include a metal. For example, the supporter RGM may be a metal plate made of a stainless material, but the material thrilling the supporter RGM is not limited thereto.

A plurality of holes R_H may be defined in the supporter RGM in a portion corresponding to the bending area BR. Therefore, bending rigidity of the portion disposed in the bending area BR of the supporter RCM may be reduced.

As shown in FIG. 3A, a width of the plurality of openings R_H in a cross-section view may be increased toward the other surface of the supporter RGM, which is opposite to one surface of the supporter RGM, from the one surface of the supporter RGM facing the lower panel layer LPL, but the configuration of the plurality of openings R_H is not limited thereto.

The plurality of openings R_H may be disposed to form various patterns such as a slit pattern, a stripe pattern, a lattice pattern or a mesh pattern in a plan view, but the shape of the plurality of openings R_H is not limited thereto.

As shown in FIG. 3A, the supporter RGM may include a plurality of segments R_SGT disposed to overlap the bending area BR in the thickness direction.

The plurality of openings R_H may be disposed between the plurality of segments R_SGT. In the cross-sectional view, the plurality of segments R_SGT are separated from the other portions of the supporter RGM, for example, the portions overlapped with the main area MR or the extension area ER, but the configuration of the plurality of segments R_SGT is not limited thereto. The plurality of segments R_SGT may be interconnected in a plan view, and may integrally (or continuously) be connected with the other portions of the supporter RGM other than the segments R_SGT.

Figure 3B:
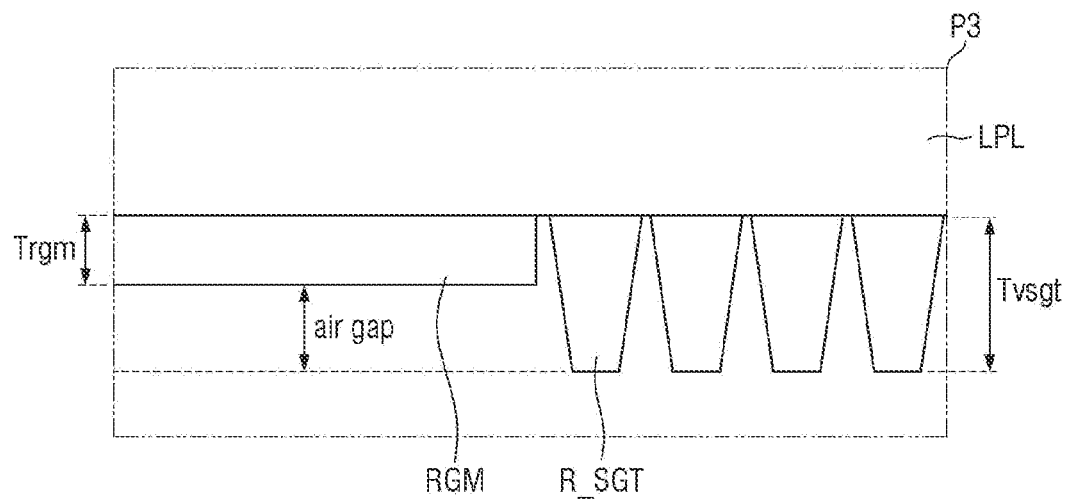
FIG. 3B is an enlarged cross-sectional view illustrating a portion 'P3' of FIG. 3A.

The supporter RGM may include an air gap for absorbing an impact when an object such as a pen of a user is dropped on the display panel DP in the main area MR. Therefore, a thickness Trgm of the supporter RGM disposed in the main area MR may be thinner than a thickness Tvsgt of each of the plurality of segments R_SGT as shown in FIG. 3B.

Referring to FIG. 4, the display panel DP may include a substrate SUB, an active element layer ATL, an encapsulation layer ENP, a stress dispersion layer SDL and a touch layer TSP.

The substrate SUB, the active element layer ATL the encapsulation layer ENP and the touch layer TSP may be disposed over the main area MR, the bending area BR and the extension area ER.

The substrate SUB may be made of an insulating material such as a polymer resin and glass. The substrate SUB may be a flexible substrate SUB capable of being subjected to bending, folding, rolling or the like. For example, the substrate SUB may include polyimide, but the material of the substrate SUB is not limited thereto.

The active element layer ATL may be disposed on one side of the substrate SUB. The active element layer ATL may include a light emitting element and a thin film transistor driving the light emitting element.

The encapsulation layer ENP may be disposed on one side of the active element layer ATL. The encapsulation layer ENP may cover the active element layer ATL to protect the active element layer ATL. The encapsulation layer ENP may include a plurality of inorganic layers and at least one organic layer.

The encapsulation layer ENP may include a first encapsulation inorganic layer CVD1, an encapsulation organic layer MN disposed on one surface of the first encapsulation inorganic layer CVD1 and a second encapsulation inorganic layer CVD2 disposed on one surface of the encapsulation organic layer MN.

For example, the first encapsulation inorganic layer CVD1 or the second encapsulation inorganic layer CVD2 may include, but is not limited to, a silicon nitride layer, a silicon oxynitride layer, a silicon oxide layer, a titanium oxide layer and/or an aluminum oxide layer. The encapsulation organic layer MN may include, but is not limited to, an acrylic resin, an epoxy resin, a phenolic resin, a polyamide resin and/or a polyimide resin. In some embodiments, the encapsulation layer ENP may include an organic insulating material or an inorganic insulating material, and may further include at least one layer disposed between the first encapsulation inorganic layer CVD1 and the active element layer ATL.

The stress dispersion layer SDL may be disposed on one surface of the encapsulation layer ENP. In detail, the stress dispersion layer SDL may be disposed on one surface of the second encapsulation inorganic layer CVD2.

The stress dispersion layer SDL, may be disposed to overlap the openings R_H of the supporter RGM in the thickness direction. A majority portions of stress dispersion layer SDL may be disposed not to overlap the supporter RGM in the thickness direction. Further, the stress dispersion layer SDL may be disposed not to overlap the plurality of segments R_SGT in the thickness direction.

The stress dispersion layer SDL may include a plurality of stress dispersion patterns SDM. As shown in FIG. 4, the plurality of stress dispersion patterns SDM may be disposed to overlap the openings in the supporter RGM in the thickness direction. The plurality of stress dispersion patterns SDM may be disposed not to overlap the supporter RGM, but the configuration of the plurality of stress dispersion patterns SDM are not limited thereto. The stress dispersion pattern SDM which is disposed to be adjacent to the supporter RGM may be disposed to partially overlap the supporter RGM in the thickness direction. Although six stress dispersion patterns SDM are illustrated in FIG. 4, the number of stress dispersion patterns SDM is not limited thereto.

A width of each of the plurality of stress dispersion patterns SDM may be reduced as the plurality of stress dispersion patterns SDM approach the second encapsulation layer ENP. For example, as shown in FIG. 4, each stress dispersion pattern SDM may have an approximate trapezoidal shape with a wide upper width on a cross-section, but the configuration of each of the plurality of stress dispersion patterns SDM is not limited thereto. The plurality of stress dispersion patterns SDM may have various shapes such as a rectangular shape, a square shape and a semicircular shape in a cross-sectional view.

The plurality of stress dispersion patterns SDM may include an organic insulating material or an inorganic insulating material. For example, the plurality of stress dispersion patterns SDM may include an acrylic resin, a methacrylate-based resin, polyisoprene, a vinyl-based resin, an epoxy-based resin, a urethane-based resin, a cellulose-based resin, a siloxane-based resin, a polyimide-based resin, a polyamide-based resin and/or a perylene-based resin. For another example, the plurality of stress dispersion patterns SDM may include an organic insulating material that includes a photosensitive material, such as photosensitive polyimide, but the material forming the plurality of stress dispersion patterns SDM are not limited thereto. The plurality of stress dispersion patterns SDM may include an inorganic insulating material such as a silicon nitride layer, a silicon oxynitride layer, a silicon oxide layer, a titanium oxide layer or an aluminum oxide layer.

A plurality of holes SDM_H may be defined between the plurality of stress dispersion patterns SDM. The plurality of holes SDM_H may be disposed to overlap the openings R_H of the supporter RGM in the thickness direction. The plurality of holes SDM_H may be disposed not to overlap the supporter RGM in the thickness direction. The plurality of holes SDM_H may be disposed to pass through the stress dispersion layer SDL, thereby defining the plurality of stress dispersion patterns SDM.

A width of each of the plurality of holes SDM_H may be increased as the holes approach the second encapsulation layer ENP. For example, as shown FIG. 4, each of the plurality of holes SDM_H may have an approximate trapezoidal (or triangular) shape with a wide lower width in a cross-sectional view, but the shape of the plurality of holes SDM_H is not limited thereto. Each of the plurality of holes SDM_H may have various shapes such as an anchor shape, a hook shape, a square shape, a rectangular shape, an oval shape or a circular shape in a cross-sectional view.

The touch layer TSP may be disposed on the encapsulation layer ENP and the stress dispersion layer SDL. The touch layer TSP may include a plurality of layers disposed in the display panel DP. The touch layer TSP may be driven in a self-capacitance mode or a mutual capacitance mode.

The touch layer TSP may include a first touch insulating layer ILD, a first touch conductive layer MTL and a second touch insulating layer PVX.

The first touch insulating layer ILD may include an organic insulating material. For example, the first touch insulating layer ILD may include, but is not limited to, a silicon nitride layer, a silicon oxynitride layer, a silicon oxide layer, a titanium oxide layer or an aluminum oxide layer.

The first touch insulating layer ILD may be disposed on the encapsulation layer ENP and the stress dispersion layer SDL. The first touch insulating layer ILD may fill the plurality of holes SDM_H disposed between the plurality of stress dispersion patterns SDM. A portion of the first touch insulating layer ILD filled in the plurality of holes SDM_H may be in direct contact with the second encapsulation inorganic layer CVD2. A portion of the first touch insulating layer ILD disposed in a portion where the stress dispersion layer SDL (the plurality of stress dispersion patterns SDM) is not disposed Wray also be in direct contact with the second encapsulation inorganic layer CVD2.

The first touch insulating layer ILD may include an inorganic insulating material. For example, the first touch insulating layer ILD may include, but is not limited to, at least one of a silicon nitride layer, a silicon oxynitride layer, a silicon oxide layer, a titanium oxide layer or an aluminum oxide layer.

A portion of the first touch insulating layer ILD filled in the plurality of holes SDM_H may perform the same function as that of an anchor, thereby preventing separation, deformation and damage of the first touch insulating layer ILD. For example, as shown in FIG. 4, a portion of the first touch insulating layer ILD filled in the plurality of holes SDM_H may have a shape of an approximate trapezoidal (or triangular) shape with a wide lower width in a cross-sectional view, but the configuration of the first touch insulating layer ILD is not limited thereto.

The first touch conductive layer MTL may be disposed on the first touch insulating layer ILD. The first touch conductive layer MTL may include a metal or a transparent conductive layer. For example, the first touch conductive layer MTL may include, for example, aluminum, titanium, copper, molybdenum, silver or their alloy, or may include a transparent conductive oxide such as indium tin oxide (ITO), indium zinc oxide (IZO), zinc oxide (ZnO), and/or indium tin zinc oxide (ITZO), a conductive polymer such as PEDOT, a metal nanowire, a graphene, etc. The first touch conductive layer MTL may include a plurality of layers. For example, the first touch conductive layer may have a three-layered structure of titanium/aluminum/titanium.

The second touch insulating layer PVX may be disposed on the first touch conductive layer MTL. The second touch insulating layer PVX may insulate the first touch conductive layer MTL by covering the same. The second touch insulating layer PVX may include an inorganic insulating material or an organic insulating material. For example, the inorganic insulating material may include, but is not limited to, a silicon nitride layer, a silicon oxynitride layer, a silicon oxide layer, a titanium oxide layer or an aluminum oxide layer, and the organic insulating material may include, but is not limited to, an acrylic resin, a methacrylate-based resin, polyisoprene, a vinyl-based resin, an epoxy-based resin, a urethane-based resin, a cellulose-based resin, a siloxane-based resin, a polyimide-based resin, a polyamide-based resin and/or a perylene-based resin.

The second touch insulating layer PVX may include a material that is substantially the same as or similar to that of the stress dispersion pattern SDM. For example, the second touch insulating layer PVX and the stress dispersion pattern SDM may include the same organic insulating material. For another example, the second touch insulating layer PVX and the stress dispersion pattern SDM may be made of the same organic material, but are not limited thereto. The material constituting the second touch insulating layer PVX may be different from that of the stress dispersion pattern SDM.

In some embodiments, the touch layer TSP may further include, but is not limited to, a second touch conductive layer disposed on the second touch insulating layer PVX and a third touch insulating layer disposed on the second touch conductive layer.

Referring to FIG. 5, when the display panel DP is bent, shearing stress may be applied to each constituents of the display panel DP. The shearing stress may properly be dispersed by the plurality of stress dispersion patterns SDM to prevent the display panel DP from being damaged and deformed.

In detail, when the display panel DP is bent, a tensile force or a compressive force may be applied to each constituents of the display panel DP depending on a position of a neutral surface according to the design of the display device 1. For example, a compressive force may mainly be applied to the substrate SUB, the active element layer ATL and the lower panel layer LPL, and a tensile force may mainly be applied to the encapsulation layer ENP and the touch layer TSP.

In this case, the constituents deposited on the plurality of segments R_SGT of the supporter RGM may be maintained to be relatively flat by the supporter RGM having a relatively strong rigidity, and a relatively strong shearing stress may intensively be applied to the constituents disposed to overlap the openings R_H of the supporter RGM, whereby the constituents may be bent to have a relatively large radius of curvature. As a result, damage and deformation of the constituents overlapping the openings R_H of the supporter RGM are likely to occur.

The display device 1 according to one embodiment of the present disclosure may include a stress dispersion layer SDL interposed between the touch layer TSP and the encapsulation layer ENP, and including a plurality of stress dispersion patterns SDM. The shearing stress concentrated on a specific portion between the plurality of segments R_SGT may be dispersed to the holes SDM_H disposed between the plurality of stress dispersion patterns SDM. That is, the display device 1 according to one embodiment may prevent the display panel DP from being damaged and deformed by dispersing the shearing stress generated during bending of the display panel DP into a plurality of areas between the plurality of stress dispersion patterns SDM.

Figure 7:
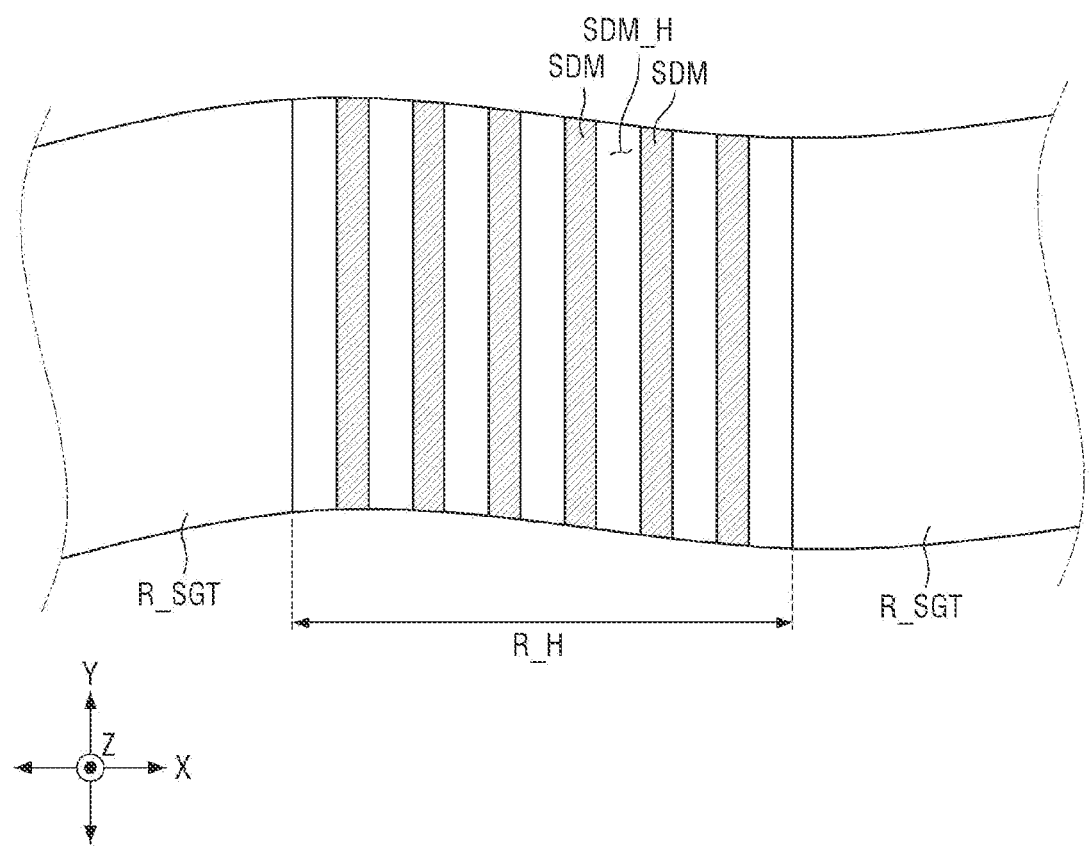
FIG. 7 is a cross-sectional view illustrating a display device according to another embodiment of the present disclosure.

Referring to FIGS. 6 and 7, the openings R_H between the plurality of segments R_SGT may extend in the second direction Y. The plurality of stress dispersion patterns SDM and the plurality of holes SDM_H disposed between the plurality of stress dispersion patterns SDM may be arranged in the first direction X in a plan view. Each of the stress dispersion patterns SDM and the plurality of holes SDM_H may extend in the second direction Y crossing the first direction X. Widths of the stress dispersion pattern SDM and the gap SDM_H in the first direction X may be smaller than the width of the hole R_H of the supporter RGM in the first direction X. For example, the plurality of stress dispersion patterns SDM may have a bar shape or a stripe shape extending in the second direction Y in a plan view, but the configuration of the plurality of stress dispersion patterns SDM are not limited thereto.

For example, the first direction X may be a direction in which a tensile force or a compressive force of the display panel DP is applied, and the second direction Y may be a direction crossing the direction in which the tensile force or the compressive force is applied, but the direction are not limited thereto. The second direction Y may be the direction in which the tensile force or the compressive force of the display panel DP is applied, and the first direction X may be the direction crossing the direction in which the tensile force or the compressive force is applied.

A plane shape of the plurality of stress dispersion patterns SDM may have a shape similar to that of the hole R_H of the supporter RGM. For example, as shown in FIG. 6, when the hole R_H of the supporter RGM is defined as a stripe shape or a rectangular shape that extends in the second direction Y, each stress dispersion pattern SDM may also have a stripe shape or a rectangular shape that extends in the second direction Y, but the configuration of the stress dispersion pattern SDM is not limited thereto. The plane shape of the plurality of stress dispersion patterns SDM may be different from that of the hole R_H of the supporter RGM.

FIG. 6 is a cross-sectional view illustrating a display device according to another embodiment of the present disclosure.

Referring to FIG. 6, the plurality of stress dispersion patterns SDM may include one surface facing the second touch insulating layer PVX, wherein one surface of the stress dispersion pattern SDM may have an uneven shape in a cross-sectional view.

In detail, an uneven portion including a plurality of concave portions and a plurality of convex portions may be formed on one surface of the stress dispersion pattern SDM opposite to the first touch conductive layer MTL or the second touch insulating layer PVX, for example, on an upper surface of the stress dispersion pattern SDM of FIG.

6. Therefore, a contact area between the stress dispersion pattern SDM and the first touch insulating layer ILD may be increased, whereby an adhesive force between the stress dispersion pattern SDM and the first touch insulating layer ILD ray be improved.

In FIG. 6, the uneven portion is disposed only on one surface of the stress dispersion pattern SDM, but the configuration of the surface of the stress dispersion pattern SDM is not limited thereto. The uneven portion may be disposed on a side of the stress dispersion pattern SDM disposed between the one surface of the stress dispersion pattern SDM and the other surface opposite to the one surface of the stress dispersion pattern SDM.

The embodiment of FIG. 6 is substantially the same as or similar to the embodiments of FIGS. 1 to 6 except that the stress dispersion pattern SDM includes an uneven portion, and thus its repeated description will be omitted.

Figure 8:
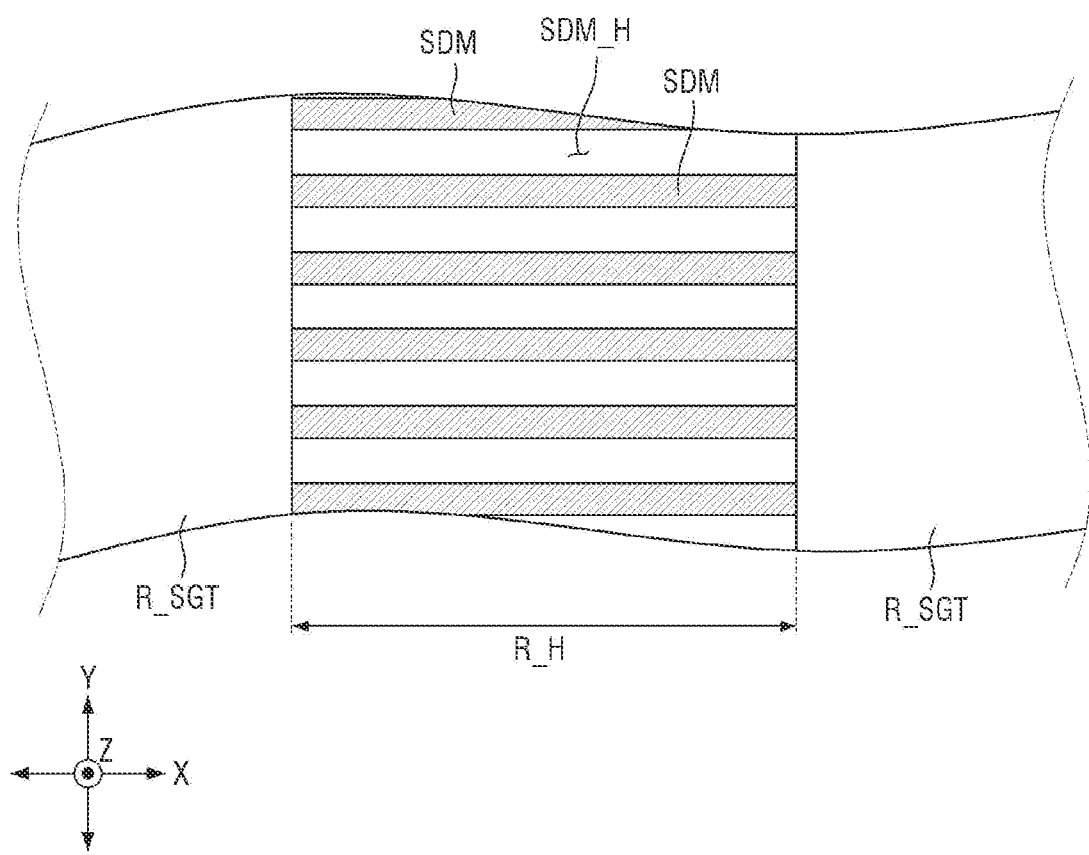
FIG. 8 is a plan view illustrating a plurality of stress dispersion patterns according to another embodiment of the present disclosure.

FIG. 8 is a plan view illustrating a plurality of stress dispersion patterns according to another embodiment.

Referring to FIG. 8, the plurality of stress dispersion patterns SDM may be arranged in the second direction 1, and each stress dispersion pattern SDM may extend in the first direction X. The plurality of holes SDM_H between the plurality of stress dispersion patterns SDM may also be arranged in the second direction Y, and each hole SDM_H may be extended in the first direction X. The width of each stress dispersion pattern SDM in the second direction Y and the width of each hole SDM_H in the second direction Y may be smaller than the width of the hole R_H of the supporter RGM in the first direction X.

The length of each stress dispersion pattern SDM in the first direction X may substantially be the same as the width of the hole R_H of the supporter RGM in the first direction X. The stress dispersion pattern SDM may not overlap the supporter RGM in the thickness direction, but the configuration of the stress dispersion pattern SDM is not limited thereto. The length of each stress dispersion pattern SDM in the first direction may be greater than or smaller than the width of the hole R_H of the supporter RGM in the first direction X. When the length of the stress dispersion pattern SDM in the first direction X is greater than the width of the hole R_H of the supporter RGM in the first direction X, both ends of the stress dispersion pattern SDM may overlap the segments R_SGT in the thickness direction.

Referring to FIGS. 6 and 8, when the extension direction of each stress dispersion pattern SDM varies, the coupling force of the first touch insulating layer ILD with respect to the plurality of stress dispersion pattern SDM and the dispersion direction of the shearing stress may vary. For example, when each stress dispersion pattern SDM extends in the first direction X, the tensile force or compressive force applied to the display panel DP may be more dispersed in the second direction Y than the case when each stress dispersion pattern SDM is disposed to extend in the second direction Y.

The embodiment of FIG. 8 is substantially the same as or similar to the embodiments of FIGS. 1 to 6 except the extension direction of the plurality of stress dispersion pattern SDM.

Figure 9:
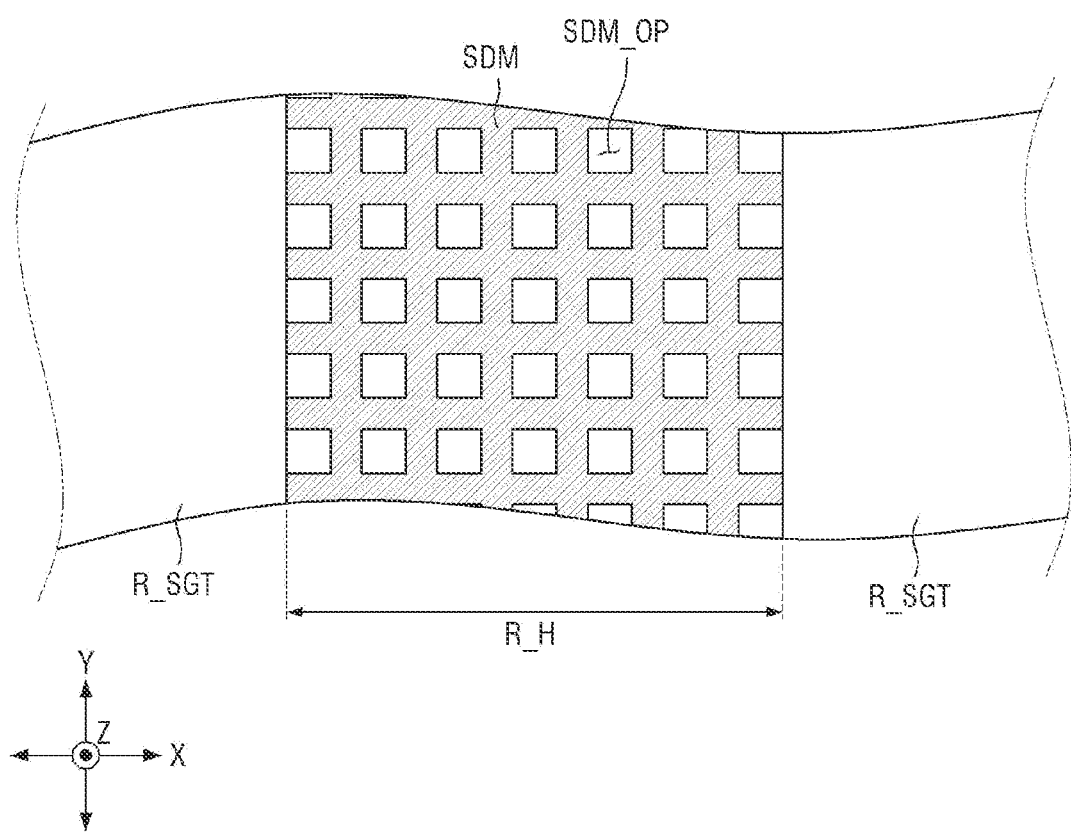
FIG. 9 is a plan view illustrating a plurality of stress dispersion patterns according to other embodiment of the present disclosure.

FIG. 9 is a plan view illustrating a plurality of stress dispersion pattern according to another embodiment.

Referring to FIG. 9, the stress dispersion layer SDL may integrally (or continuously) be disposed between the plurality of segments R_SGT to form a lattice-shaped pattern. The stress dispersion layer SDL may include a plurality of openings SDM_OP disposed at constant intervals to define a lattice-shaped pattern. In this case, the stress dispersion layer SDL may be implemented as one stress dispersion pattern SDM that includes the plurality of openings SDM/OP disposed in the one stress dispersion pattern SDM for the one stress dispersion pattern SDM to form a lattice-shaped pattern. Similar to the plurality of holes SDM_H, the plurality of openings SDM_OP of the stress dispersion layer SDL, may be filled by the first touch insulating layer ILD.

For example, each of the plurality of openings SDM_OP may have an approximate square shape in a plan view, but the configuration of the plurality of openings SDM_OP is not limited thereto. Each of the plurality of openings SDM_OP may have various shapes such as a rectangular shape, a circular shape and an oval shape in a plan view.

The stress dispersion layer SDL may be disposed to overlap the hole R_H between the segments R_SGT. The stress dispersion layer SDL may be disposed not to overlap the segments R_SGT. However, the stress dispersion layer SDL may be disposed to overlap edges of the segments R_SGT.

As the stress dispersion layer SDL is disposed to form a lattice-shaped pattern, damage and deformation of the display panel DP due to the shearing stress applied in the first direction X and the shearing stress applied in the second direction Y may be avoided.

The stress dispersion layer SDL may include an organic insulating material or an inorganic insulating material. For example, the organic insulating material may include, but is not limited to, an acrylic resin, a methacrylate-based resin, polyisoprene, a vinyl-based resin, an epoxy-based resin, a urethane-based resin, a cellulose-based resin, a siloxane-based resin, a polyimide-based resin, a polyamide-based resin and/or a perylene-based resin, and the inorganic insulating material may include, but is not limited to, a silicon nitride layer, a silicon oxynitride layer, a silicon oxide layer, a titanium oxide layer or an aluminum oxide layer.

The stress dispersion layer SDL may include a material that is substantially the same as or similar to the material constituting the second touch insulating layer PVX. The stress dispersion layer SDL and the second touch insulating layer PVX may include the same organic insulating material, but the material forming the stress dispersion layer SDL and the second touch insulating layer PVX are not limited thereto. The stress dispersion layer SDL may be made of a material different from the material constituting the second touch insulating layer PVX.

The embodiment of FIG. 9 is substantially the same as or similar to the embodiments of FIGS. 1 to 6 except the plane shape of the stress dispersion layer SDL, and thus its repeated description will be omitted.

Figure 10:
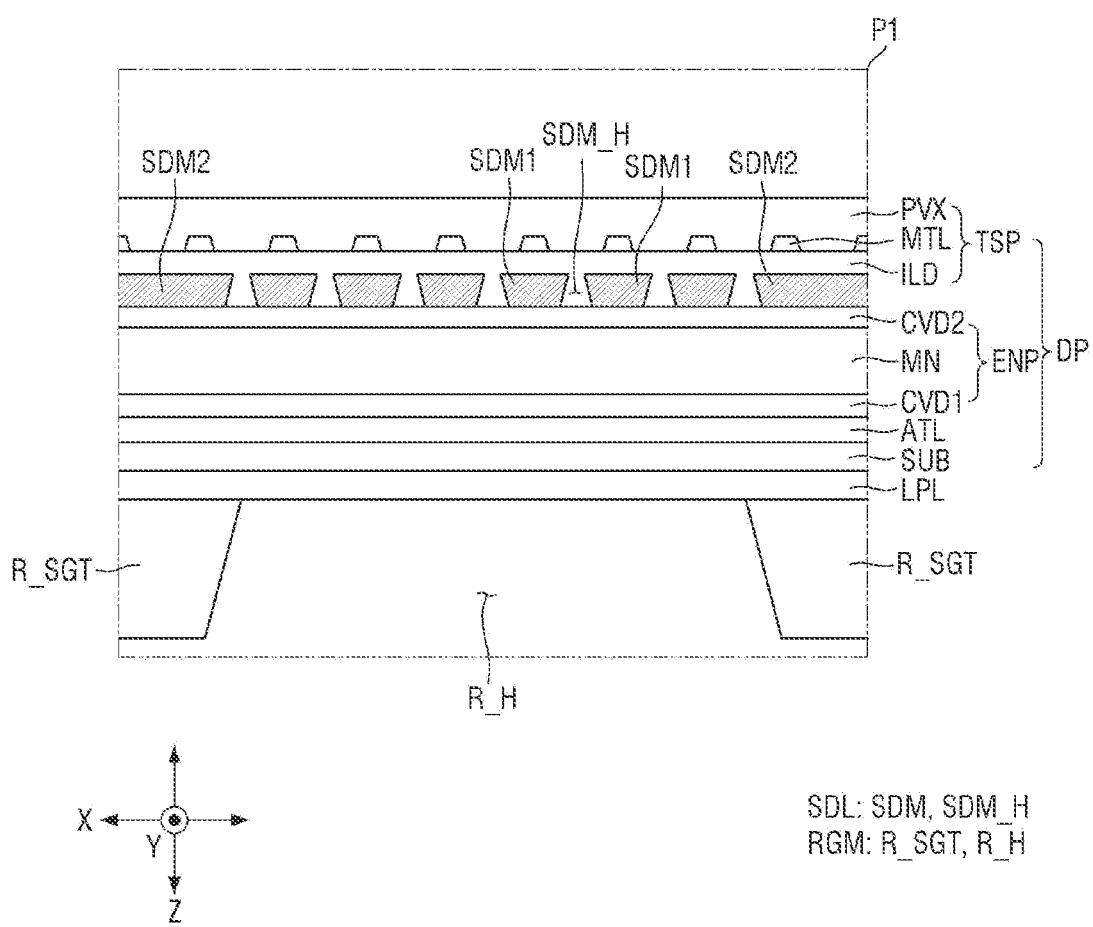
FIG. 10 is a cross-sectional view illustrating a display device according to other embodiment of the present disclosure.

FIG. 10 is a cross-sectional view illustrating a display device 1 according to another embodiment.

Referring to FIG. 10, the stress dispersion layer SDL may include a plurality of first stress dispersion patterns SDM1 and a plurality of second stress dispersion patterns SDM2 which are disposed on the second encapsulation organic layer CVD2.

The plurality of first stress dispersion patterns SDM1 may be disposed to overlap the openings of the supporter RGM in the thickness direction. The plurality of first stress dispersion patterns SDM1 may be disposed not to overlap the segments R_SGT of the supporter RGM in the thickness direction. However, the plurality of first stress dispersion patterns SDM1 may overlap edges of the segments R_SGT of the rigid supporter RGM in the thickness direction.

The plurality of first stress dispersion patterns SDM1 may substantially be the same as or similar to the stress dispersion patterns SDM of FIGS. 1 to 6.

The plurality of second stress dispersion patterns SDM2 may be disposed to overlap the segments R_SGT of the supporter RGM in the thickness direction, respectively. For example, one second stress dispersion pattern SDM2 may be disposed on one segment R_SGT, but the configuration of the one second stress dispersion pattern SDM2 is not limited thereto.

A width of the second stress dispersion pattern SDM2 in the first direction X may be greater than that of the first stress dispersion pattern SDM1 in the first direction X, but the configuration of the second stress dispersion pattern SDM2 is not limited thereto. The width of the second stress dispersion pattern SDM2 in the first direction X may be less than or equal to the width of the first stress dispersion pattern SDM1 in the first direction X.

As the second stress dispersion pattern SDM2 is disposed, shearing stress at a boundary portion of the segments R_SGT may be more easily dispersed than the case when only the first stress dispersion pattern SDM1 is disposed. When the plurality of second stress dispersion patterns SDM2 are disposed to overlap one segment R_SGT, shearing stress applied onto one segment R_SGT may further be dispersed to at least one gap SDM_H overlapping the one segment R_SGT.

In FIG. 10, an end of the second stress dispersion pattern SDM2 is aligned with that of the segment R_SGT in the thickness, but the configuration of the second stress dispersion pattern SDM2 is not limited thereto. The end of the second stress dispersion pattern SDM2 may be disposed to overlap a middle portion of the segment R_SGT or the hole R_H.

The embodiment of FIG. 10 is substantially the same as or similar to the embodiments of FIGS. 1 to 6 except the second stress dispersion pattern SDM2, and thus its repeated description will be omitted.

Figure 11:
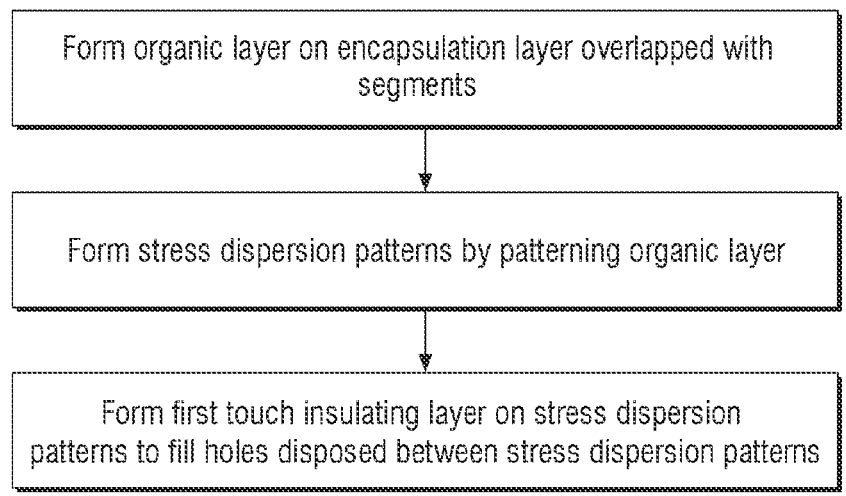
FIG. 11 is a flow chart illustrating a method of fabricating a display device according to one embodiment of the present disclosure.

FIG. 11 is a flow chart illustrating a method of fabricating a display device according to one embodiment of the present disclosure. FIGS. 12 to 15 are cross-sectional views illustrating steps of a method of fabricating a display device according to one embodiment of the present disclosure.

Referring to FIGS. 11 to 15, the method of fabricating a display device according to one embodiment of the present disclosure may include the steps of: forming an organic layer SDL_O on an encapsulation layer ENP overlapped with a plurality of segments R_SGT; forming a plurality of stress dispersion patterns SDM by patterning the organic layer SDL_O; and thrilling a first touch insulating layer ILD on the plurality of stress dispersion patterns SDM to fill holes SDM_H between the plurality of stress dispersion patterns SDM.

The method of fabricating a display device is not limited to the above example, and at least a portion of the respective steps may be omitted, or at least one step may further be included with reference to another reference of the present disclosure.

Figure 12:
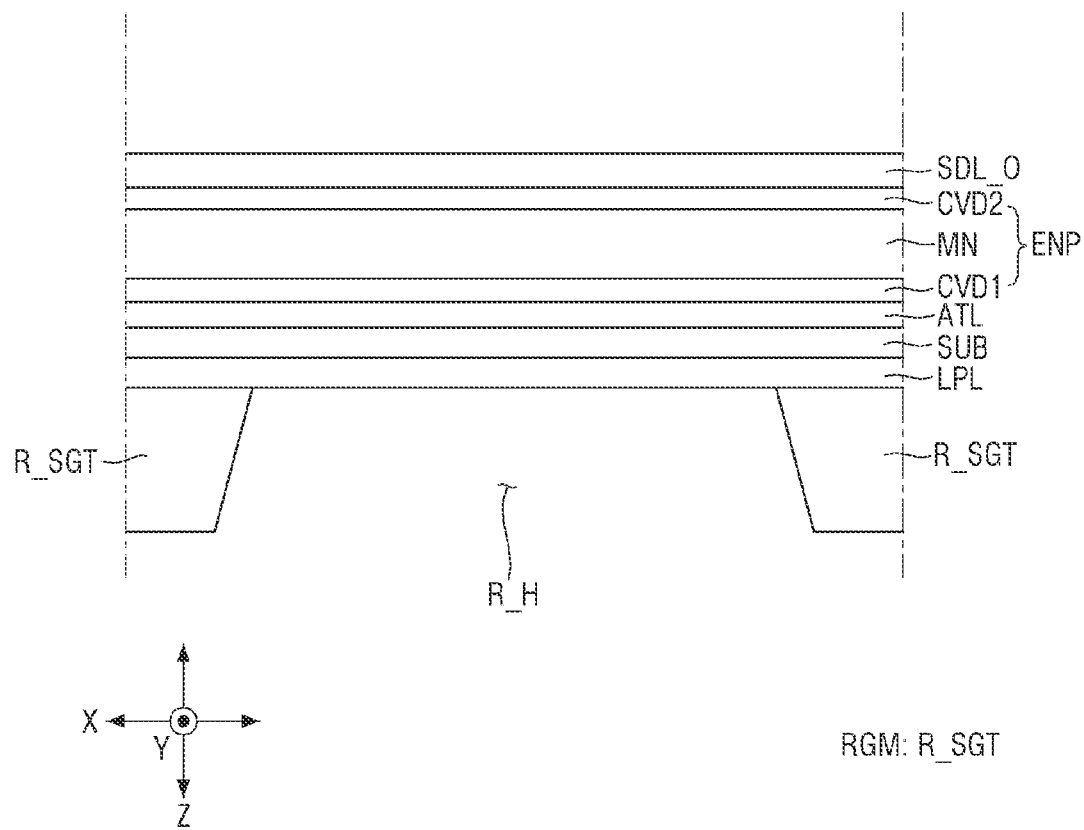
FIGS. 12, 13, 14 and 15 are cross-sectional views illustrating steps of a method of fabricating a display device according to one embodiment of the present disclosure.

Referring to FIG. 12, an active element layer ATL may be formed on one surface of a substrate SUB, and an encapsulation layer ENP may be formed on the active element layer ATL. A lower panel layer LPL may be formed on the other surface of the substrate SUB, and a supporter RGM may be formed on the lower panel layer LPL. The lower panel layer LPL or the supporter RGM may be formed before the active element layer ATL or the encapsulation layer ENP is formed, or may be formed after the active element layer ATL or the encapsulation layer ENP is formed.

After the encapsulation layer ENP is formed, the organic layer SDL_O may be formed on the second encapsulation inorganic layer CVD2. For example, the organic layer SDL_O may include an organic insulating material such as an acrylic resin, a methacrylate-based resin, polyisoprene, a vinyl-based resin, an epoxy-based resin, a urethane-based resin, a cellulose-based resin, a siloxane-based resin, a polyimide-based resin, a polyamide-based resin and/or a perylene-based resin. For another example, the organic layer SDL-O_may include an organic insulating material that includes a photosensitive material such as a photosensitive polyimide, but is not limited thereto. The organic layer SDL_O may be replaced with an inorganic layer that includes an inorganic insulating material such as a silicon nitride layer, a silicon oxynitride layer, a silicon oxide laver, a titanium oxide layer or an aluminum oxide layer.

Figure 13:
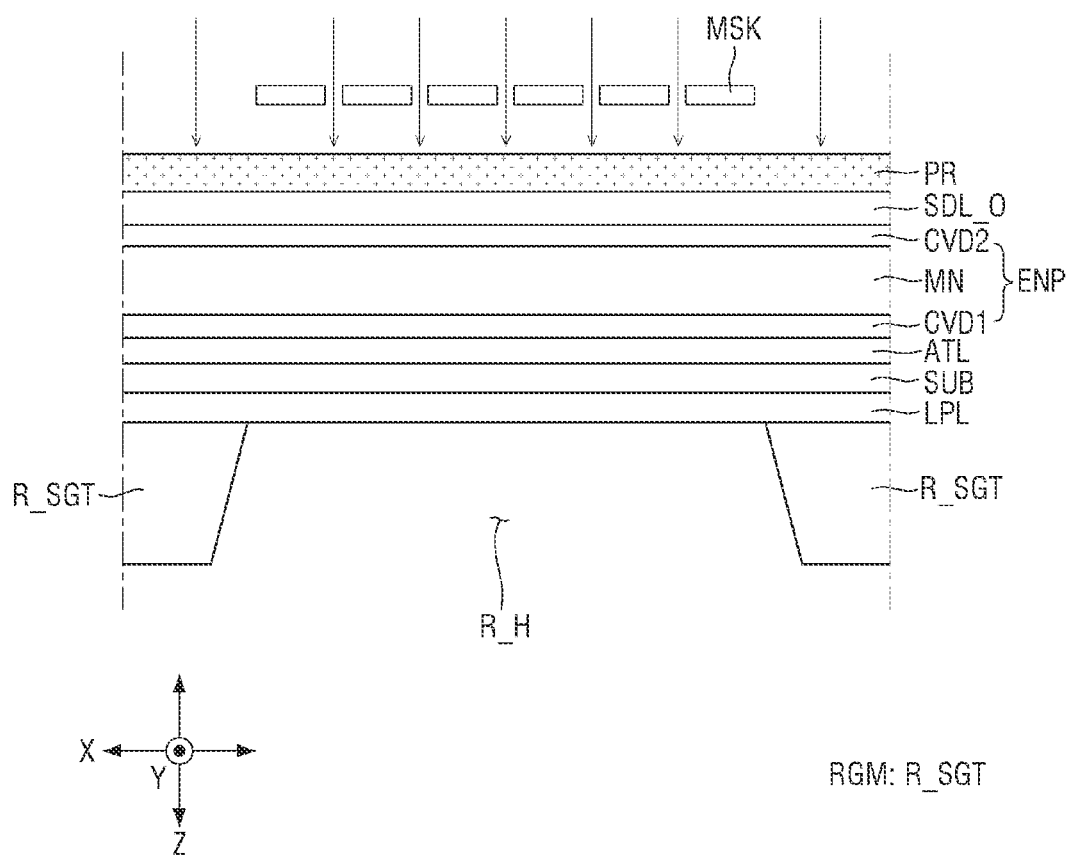

Referring to FIG. 13, after the organic layer SDL_O is formed, a photolithography process for patterning the organic layer SDL_O may be performed.

As shown in FIG. 13, a photoresist layer PR including a photoresist may be coated on the organic layer SDL_O. For example, the photoresist may be a positive photoresist, but the photoresist is not limited thereto. The photoresist may be a negative photoresist.

After a mask MSK provided with a plurality of openings may be disposed on the photoresist layer PR, an exposure process of exposing the photoresist through the opening may be performed.

Figure 14:
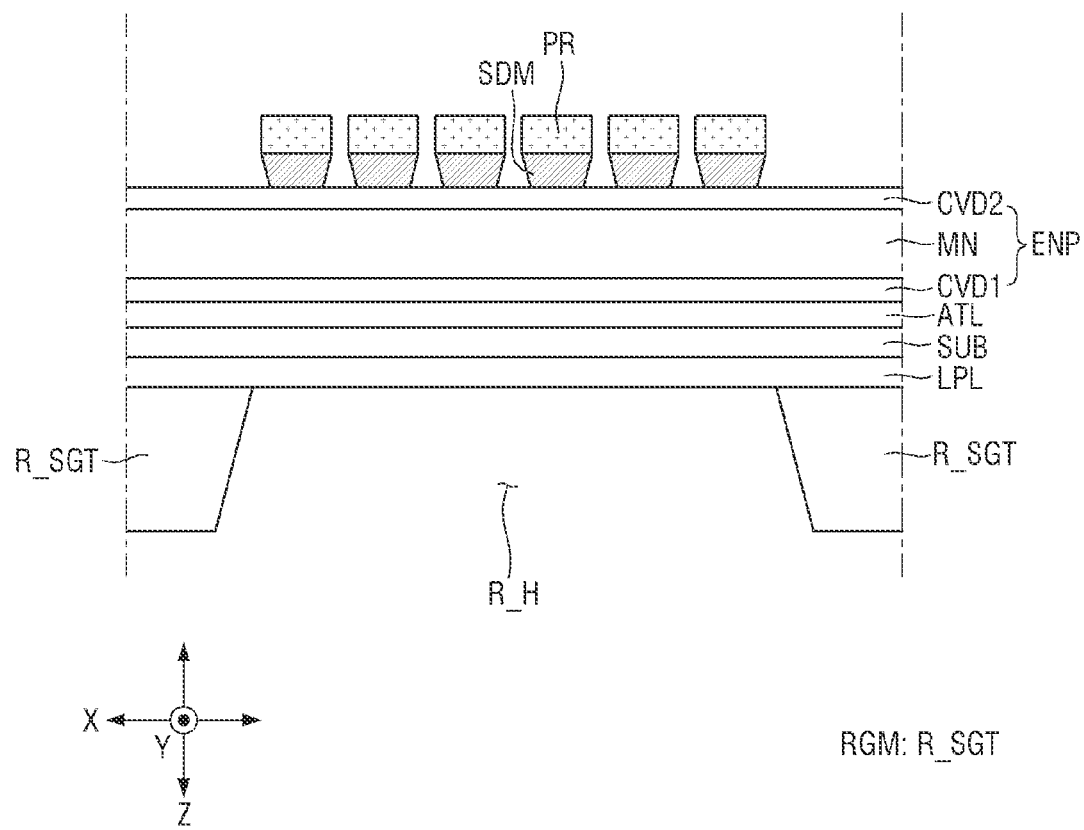

Referring to FIG. 14, after the exposure process is completed, a developing process for removing the exposed photoresist and an etching process for etching the organic layer SDL_O may sequentially be performed.

As the exposed photoresist is removed by a developing solution and a portion of the organic layer SDL_O which is not covered by the photoresist is removed, the plurality of stress dispersion patterns SDM may be formed on the second encapsulation inorganic layer CVD2 as shown in FIG. 14.

When the etching process is performed, an etching bias may be adjusted such that the organic layer SDL_O is etched to have undercut portions. Therefore, as shown in FIG. 14, the widths of the plurality of holes SDM_H between the plurality of stress dispersion patterns SDM may be increased toward the second encapsulation inorganic layer CVD2. However, as described above, the cross-sectional shape of the plurality of holes SDM_H thrilled by the etching process is not limited to the above example.

After the etching process, the photoresist layer PR remained on the plurality of stress dispersion patterns SDM may be stripped and removed.

Referring to FIGS. 6 and 8, the plurality of stress dispersion patterns SDM may be formed to extend in the first direction X or the second direction Y by the photolithography process. Referring to FIG. 9, the organic layer SDL_O may be etched to form a stress dispersion layer SDL having a lattice-shaped pattern.

In some embodiments, when the organic layer SDL_O is replaced with an inorganic layer, the photolithography process may be replaced by a deposition process of depositing an inorganic layer in accordance with a pattern. In some embodiments, when the organic layer SDL_O includes a photosensitive organic material, the process of coating and removing the photoresist may be omitted.

Figure 15:
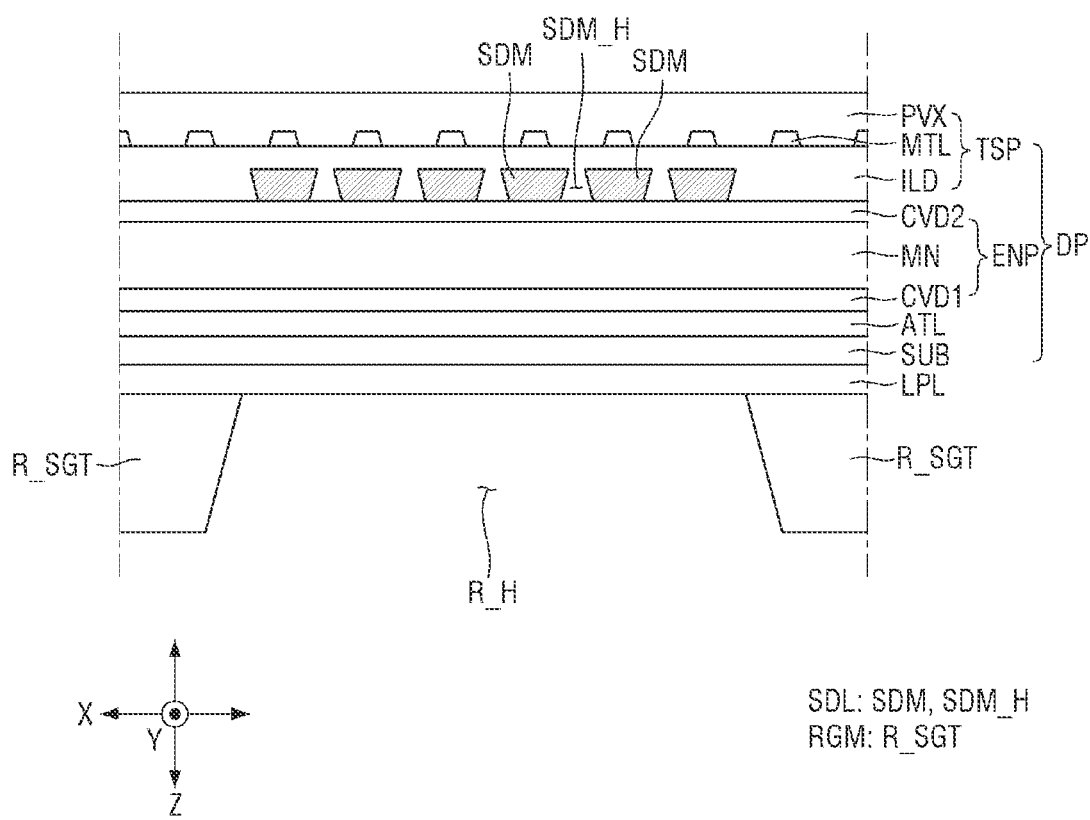

Referring to FIG. 15, after the remaining photoresist layer PR is removed, a first touch insulating layer ILD may be formed on the plurality of stress dispersion patterns SDM and the second encapsulation inorganic layer CVD2. The first touch insulating layer ILD may be formed by the deposition process, but the process forming the first touch insulating layer ILD is not limited thereto.

The first touch insulating layer ILD may be formed to cover the plurality of stress dispersion patterns SDM. The first touch insulating layer ILD may fill the plurality of holes SDM_H. As shown in FIG. 15, a portion of the first touch insulating layer ILD filled in the plurality of holes SDM_H may be in direct contact with the second encapsulation inorganic layer CVD2. In addition, the first touch insulating layer ILD and the second encapsulation inorganic layer CVD2 may be in direct contact with each other even in an area where the plurality of stress dispersion patterns SDM are not disposed.

After the first touch insulating layer ILD is formed, a first touch conductive layer MTL and a second touch insulating layer PVX may sequentially be formed on the first touch insulating layer ILD. In some embodiments, a second touch conductive layer may be formed on the second touch insulating layer PVX and then a third touch insulating layer may further be formed on the second touch conductive layer. Afterwards, a cover window CW may be attached onto the touch layer TSP by an adhesive such as an optical transparent resin.

In the display device and the method of fabricating the same according to the embodiments, stress applied to a display panel may be dispersed to prevent the display panel from being damaged.

The current disclosure should not be construed as being limited to the embodiments et forth herein. Rather, these embodiments are provided so that this disclosure will be thorough and complete and will fully convey the concept of the inventive concept to those skilled in the art.

While the current disclosure have been particularly shown and described with reference to some embodiments thereof, it will be understood by one of ordinary skill in the art that various changes in form and detail may be made therein without departing from the spirit and scope of the current disclosure as defined by the following claims.

What is claimed is:

1. A display device comprising:
a supporter including a plurality of segments disposed to be spaced apart from each other and including a plurality of openings disposed between the plurality of segments; and
a display panel disposed on the supporter,
wherein the display panel includes:
an active element layer including a light emitting element and a thin film transistor for driving the light emitting element,
an encapsulation layer disposed on the active element layer,
a plurality of stress dispersion patterns disposed on the encapsulation layer to overlap the plurality of openings in a thickness direction, and
an insulating layer disposed on the plurality of the stress dispersion patterns and filling a plurality of holes disposed between the plurality of the stress dispersion patterns,
wherein each of the plurality of openings overlaps at least one of the holes in the thickness direction.

2. The display device of claim 1, wherein each width of the plurality of holes in a cross-sectional view is increased toward the encapsulation layer.

3. The display device of claim 1, wherein a width of the insulating layer filled in the plurality of holes in a cross-sectional view is increased toward the encapsulation layer.

4. The display device of claim 1, wherein at least one surface of plurality of the stress dispersion patterns have an uneven surface in a cross-sectional view.

5. The display device of claim 1, wherein the plurality of the stress dispersion patterns include an organic insulating material.

6. The display device of claim 5, wherein the organic insulating material includes at least one of an acrylic resin, a methacrylate-based resin, polyisoprene, a vinyl-based resin, an epoxy-based resin, a urethane-based resin, a cellulose-based resin, a siloxane-based resin, a polyimide-based resin, a polyamide-based resin and a perylene-based resin.

7. The display device of claim 1, wherein the plurality of the stress dispersion patterns extend in a direction parallel to a direction in which the plurality of openings extend in a plane view.

8. The display device of claim 1, wherein the plurality of the stress dispersion patterns extend in a direction crossing a direction in which the plurality of openings extend in a plan view.

9. The display device of claim 1, wherein the display panel includes a main area, an extension area overlapped with the main area in the thickness direction, and a bending area disposed between the main area the extension area, the display device further comprising a roller disposed adjacent the bending area, moving in a first direction and rotating in a first rotational direction or a second rotational direction.

10. The display device of claim 9, wherein, when the roller moves toward one side of the first direction and rotates in the first rotational direction, the extension area moves toward one side of the first direction, and when the roller moves toward the other side of the first direction and rotates in the second rotation direction, the extension area moves toward the other side of the first direction.

11. The display device of claim 9, wherein a thickness of the supporter in the main area is thinner than a thickness of each of the plurality of segments.

12. A display device comprising:
a supporter including a plurality of openings;
an encapsulation layer disposed on the supporter;
a plurality of stress dispersion patterns disposed on the encapsulation layer and spaced apart from each other to define a plurality of openings disposed between the plurality of the stress dispersion patterns;
an insulating layer disposed on the plurality of the stress dispersion patterns to fill the plurality of openings,
wherein the plurality of the stress dispersion patterns are disposed to overlap the openings of the supporter in a thickness direction, and
wherein the plurality of the stress dispersion patterns include an organic insulating material, and each width of the plurality of openings is increased toward the encapsulation layer in a cross-sectional view.

13. The display device of claim 12, further comprising:
a display panel including the encapsulation layer, the plurality of the stress dispersion patterns and the insulating layer; and
a roller disposed adjacent to a bending area, moving in a first direction, and rotating in a first rotational direction or a second rotational direction,
wherein the display panel includes a main area, an extension area overlapped with the main area in the thickness direction and a bending area disposed between the main area and the extension area.

14. The display device of claim 13, wherein, when the roller moves toward one side of the first direction and rotates in the first rotational direction, the extension area moves toward one side of the first direction, and when the roller moves toward the other side of the first direction and rotates in the second rotational direction, the extension area moves toward the other side of the first direction.

15. The display device of claim 12, wherein the supporter including a plurality of segments disposed to be spaced apart from each other, and
   wherein a thickness of the supporter in the main area is thinner than a thickness of the segment.

16. A method of fabricating a display device, the method comprising:
   forming an organic layer on an encapsulation layer overlapped with a plurality of segments disposed in a supporter;
   forming a plurality of stress dispersion patterns by patterning the organic layer; and
   forming an insulating layer on the plurality of the stress dispersion patterns to fill holes disposed between the plurality of the stress dispersion patterns,
   wherein the forming a plurality of the stress dispersion patterns by patterning the organic layer includes etching the organic layer so that each width of the plurality of openings disposed between the plurality of the stress dispersion patterns is increased toward the encapsulation layer in a cross-sectional view.

17. The method of claim 16, wherein the forming a plurality of the stress dispersion patterns by patterning the organic layer includes patterning the organic layer such that the plurality of the stress dispersion patterns overlap an opening disposed between the plurality of segments.

* * * * *